United States Patent
Gore

(10) Patent No.: US 8,384,404 B2
(45) Date of Patent: Feb. 26, 2013

(54) SYSTEMS AND METHODS OF PREPARATION OF PHOTOVOLTAIC FILMS AND DEVICES

(75) Inventor: Makarand Prabhakar Gore, Fort Collins, CO (US)

(73) Assignee: YewSavin, Inc., Fort Collins, CO (US)

( * ) Notice: Subject to any disclaimer, the term of this patent is extended or adjusted under 35 U.S.C. 154(b) by 366 days.

(21) Appl. No.: 12/862,632

(22) Filed: Aug. 24, 2010

(65) Prior Publication Data

US 2012/0048327 A1   Mar. 1, 2012

(51) Int. Cl.
*G01R 27/08* (2006.01)
(52) U.S. Cl. ........................................................ 324/713
(58) Field of Classification Search .................. None
See application file for complete search history.

(56) References Cited

U.S. PATENT DOCUMENTS

| | | | | |
|---|---|---|---|---|
| 4,006,583 A * | 2/1977 | Vuilleumier | ................ | 368/64 |
| 4,129,823 A * | 12/1978 | van der Pool et al. | ... | 324/761.01 |
| 6,118,258 A * | 9/2000 | Farine et al. | ................ | 368/64 |
| 7,645,930 B2 * | 1/2010 | Kelly et al. | ................ | 136/244 |
| 7,733,111 B1 * | 6/2010 | Zhao et al. | ................ | 324/761.01 |
| 8,258,741 B2 * | 9/2012 | Wu et al. | ................ | 320/101 |
| 2009/0151778 A1 * | 6/2009 | Wang | ................ | 136/252 |
| 2010/0109442 A1 * | 5/2010 | Vega Betoret et al. | ......... | 307/82 |
| 2011/0006194 A1 * | 1/2011 | Pereira Morais Dos Santos et al. | ................ | 250/208.2 |
| 2011/0111134 A1 * | 5/2011 | Gore | ................ | 427/555 |
| 2011/0133750 A1 * | 6/2011 | Zapalac et al. | ................ | 324/537 |
| 2011/0301790 A1 * | 12/2011 | Atluri et al. | ................ | 701/22 |
| 2012/0139471 A1 * | 6/2012 | Dubovsky | ................ | 320/101 |

FOREIGN PATENT DOCUMENTS

GB     2437362 A   * 10/2007

\* cited by examiner

*Primary Examiner* — Jermele M Hollington
(74) *Attorney, Agent, or Firm* — Benjamin A. Balser; Balser & Grell IP Law

(57) ABSTRACT

Described herein are processes and apparatuses for preparation and optimization of photovoltaic films and film stacks with application of electrical pulses. The process achieves high photovoltaic efficiency upon application of conditioning electrical pulses to the stack or layers of deposited photovoltaic films. This may be done at manufacture, or in the field at certain time intervals. The films of photovoltaic devices may be optimized by application of programmed voltage pulses. Furthermore, it is possible to deliver larger portion of energy from the pulse to a particular layer of a multi-stack film by rendering one or more layers of the film relatively more conductive using exposure to selected narrow wavelength of light corresponding to the band gap of the particular layer.

20 Claims, 3 Drawing Sheets

SYSTEMS AND METHODS OF PREPARATION OF PHOTOVOLTAIC FILMS AND DEVICES

TECHNICAL FIELD

The present disclosure is generally related to electronics, and more particularly, is related to photovoltaic films and devices.

BACKGROUND

Solar power is an important source of renewable electrical energy. The continuous challenge in the field of solar energy is to develop and manufacture photovoltaic devices having a high efficiency for converting sunlight into electrical energy.

SUMMARY

Example embodiments of the present disclosure provide methods of preparation of photovoltaic films and devices. In this regard, one embodiment of such a method, among others, can be broadly summarized by the following steps: measuring current/voltage (J/V) characteristics of a photovoltaic material; applying a single electrical pulse to the photovoltaic material within the measured or calculated range of energy; determining an energy range that produces a maximum efficiency for the photovoltaic material; applying a train of electrical pulses within the measured energy range; and determining a pulse and/or train of pulses which produces a maximum efficiency for the photovoltaic material.

Embodiments of the present disclosure can also be viewed as providing systems for preparation of photovoltaic films and devices. Briefly described, in architecture, one example embodiment of the system, among others, can be implemented as follows: a voltage source configured to output voltage pulses; a control circuit electrically connected to the output of the voltage source, the control circuit configured to apply the voltage pulses to a photovoltaic material; and a feedback circuit electrically connected to the photovoltaic material, the feedback circuit configured to measure resistance and energy/voltage (J/V) characteristics of the photovoltaic material.

BRIEF DESCRIPTION OF THE DRAWINGS

The invention is described in reference to several drawings to illustrate the embodiments.

DETAILED DESCRIPTION

Figure 1:
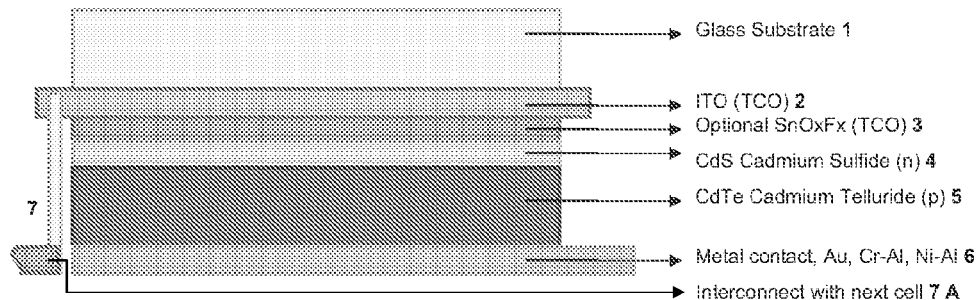
FIG. 1 is a block diagram of an exemplary embodiment of a Cadmium Telluride (CdTe) photovoltaic device.

Although the present disclosure includes reference to example embodiments, those skilled in the art may recognize and make changes in form and detail without departing from the spirit and scope of the claimed subject matter in practice. For example, although different example embodiments may have been described as including one or more features providing one or more benefits, it is contemplated that the described features may be interchanged with one another or alternatively be combined with one another in the described example embodiments or in other alternative embodiments. Because the technology is relatively complex, not all variation of the technology can be described. The example embodiments set forth in the following claims are very broadly applicable. For example, unless specifically otherwise noted, the claims reciting a single particular element may also encompass a plurality and combination of such particular elements, offering value due to combinations of such elements.

Certain terms used throughout the following description and claims refer to particular system components. As those skilled in the art will appreciate, experts may refer to components by different names. This disclosure does not intend to distinguish between components that differ in name but not function. In the following discussion and in the claims, the terms "including" and "comprising" are used in an open-ended fashion, and thus should be interpreted to mean "including, but not limited to . . . " The term "absorber" is a light absorbing material upon which irradiation is known to produce electric current when in contact with electrodes and a load. The electric charge separation to produce electrical potential in the devices upon exposure to light is generally accepted to occur at the semiconductor 'junction' of the device, although all the component and materials are important for achieving the efficiency. Therefore, the terms 'material', 'film', 'device', 'devices', as used herein are defined as an individual layer, a stack of layers, or the 'junction' or material at the boundary of the semiconductor or conductor layers, and multiple similar devices. As used herein, the term "energy" is energy in form of joule heating, radiation heating, or electro-chemical energy that drives change in phase, element gradient, or chemical structure of the device materials. The term phase change is used to indicate any changes in chemical gradient, elemental composition, electrical, crystalline to amorphous (and vice versa), grain and morphology changes. By way of example only, electrodes may be transparent conducting electrodes such as Indium Tin Oxide, or composed of Tin Oxide/Fluoride, or metallic films such as molybdenum, aluminum, silver or other metal such as nickel and alloys or any transparent conductors such as carbon nanotubes or graphene films. As a non-limiting example, a band of radiation may mean a narrow band of approximately <100 nm width at full width-half max (FWHM) of peak; that will specifically render one layer of photovoltaic devices more conductive than others.

The present disclosure relates to methods of manufacture of efficient photovoltaic films and devices. The disclosure also relates to enhancement of performance of manufactured and installed devices. The disclosure further relates to performance enhancement of aged or fatigued devices installed and in use for some time. The disclosure describes a method to achieve high performance in manufacturing and maintain high efficiency of the photovoltaic devices that might have suffered degradation from factors such as prolonged heat and light exposure.

In recent years, extensive efforts have been put into cost effective manufacture of photovoltaic devices. In general, most studies focus on deposition techniques to achieve film and stack characteristics for best performance. The structure of the absorber layers as in Cadmium Telluride (CdTe) and Copper Indium Gallium Selenide (CIGS) or Copper Indium Selenide (CIS) affects the cell performance. A variety of chemical and physical deposition techniques, and post processes such as thermal annealing have been studied towards this goal. These processes invariably result in high variation due to difficulty in maintaining precise conditions, especially in a manufacturing environment. Furthermore, the performance of these devices depends on the phases of the absorber layers. The phases of the layers are 'meta-stable' structures that undergo changes over time resulting in degradation of performance. Optimization of the meta-stable layers by post deposition treatments such as pulsed laser annealing may provide enhancement in the performance of photovoltaic devices. For example, non-melt 248 nm LASER annealing is reported to show improved performance as described by Wang, X.; Li, S. S.; Huang, C. H.; Rawal, S.; Howard, J. M.; Craciun, V.; Anderson, T. J.; and Crisalle, O. D. in Solar Energy Materials & Solar Cells, 88, 65-73 (2005). These studies do not anticipate, nor directly correlate change in electronics properties by electric Joule (Ohmic or resistive) heating to improvement of photovoltaic performance. Furthermore, such methods are not cost effective or practical in manufacturing or field application environments due to expensive and unsafe high-power LASERS.

It is known that the electronic properties such as resistance of chaclogenides can be modulated using electrical pulses. For example—use of chalcogenides is proposed in memory devices as described by Lee, H.; Kang, D-H; Tran, L. in Materials Science and Engineering B, 119, 196-201, incorporated herein by reference. However, optimization of photovoltaic properties using electrical pulses is not anticipated by the authors, nor apparent from these studies, which report resistance measurement relative to phases of materials for use in memory states for RAM.

The manufacturing methods for photovoltaic devices in processes described so far have focused on deposition processes for best photovoltaic performance. Example embodiments of this disclosure may provide for an efficient method to prepare and optimize photovoltaic by processing of films and films stacks after deposition. The approach provides for a method for optimization of photovoltaic films using application of electrical pulses. Since the films and materials are assembled in the final position in the device, the method may be described as in-situ Optimization by Electrical Pulses, abbreviated as i-SOEP technology.

Example embodiments of this disclosure may include efficient and practical processes for achieving high photovoltaic efficiency by delivery of electrical pulses to photovoltaic devices, at manufacture, or in the field. Example embodiments of this disclosure may also include certain time intervals for application of optimization pulses such as any exemplary programmable period of 12 h, 24 h, 48 h, 7 days, 2 weeks etc., said pulses being of exemplary magnitudes and time ranges of 0.1 V to 240V and 70 microseconds, and 0.1 V to 300V and 70 nanoseconds, per square centimeter area of the films. Depending upon the number of independent cells or film stacks in series or in parallel, the voltage may be set to any value to deliver the required energy per unit volume ($E/cm^3$) to cause desired phase change in the specified time. Example embodiments also define energy density (energy per unit area) input ranges for optimization, without limitation, preferably between 100 J/cm$^3$ to 4000 J/cm$^3$, more preferably between 150 J/cm$^3$ to 1500 J/cm$^3$ and most preferably between 250 J/cm$^3$ to 450 J/cm$^3$. The energy required for the optimization may depend upon initial state of the absorber films. In an example, a two pulse sequence may be used—one for conditioning, and one for optimization. In case of higher resistance films higher energy pulses may be used, the preferred energy input for conditioning pulse is 1000 J/cm$^3$ to 4000 J/cm$^3$, and second optimization pulse is 250 J/cm$^3$ to 450 J/cm$^3$ Example embodiments of this disclosure may include methods of selective delivery of energy from the electrical pulses to a particular layer of the photovoltaic film stacks. This may be accomplished by the application of electrical pulses under a band of radiation that may render some layers of the stack conductive (less resistive), while the other layers maintain higher resistance R. The energy a layer receives is $I^2R$, and since the current "I" through the layers is substantially the same, the layer with higher resistance "R" will receive higher portion of energy. Since the most conductive layers receive less energy, the resistive layers are selectively processed.

Example embodiments of this disclosure may provide pulse generator and exposure systems used for optimization of photovoltaic devices.

Example embodiments of this disclosure may include elements and compositions that are amenable to optimization for photovoltaic performance using the i-SOEP technology.

In one compositional aspect, optimization of photovoltaic devices may be accomplished using chalcogenides.

In another specific aspect of the disclosure, Selenides of Copper, Indium, Selenide (CIS), and Selenides of Copper, Indium, Gallium (CIGS) may be used.

In yet another special composition the disclosure may provide for optimization of photovoltaic devices containing Cadmium Tellurides (CdTe) and cadmium sulfides.

In yet another special composition, the photovoltaic devices may contain silicon.

Example embodiments of the methods disclosed herein may provide for application of AC pulses, in particular high frequency AC pulses to photovoltaic films or devices.

Example embodiments of the methods disclosed herein may also provide for application of DC pulses in forward or reverse polarity to photovoltaic films or devices.

Example embodiments of the methods disclosed herein may provide for mixed AC and DC signals in either polarity to photovoltaic films or devices.

Example embodiments of the methods may further provide for specifically designed pulse sequences, and amplitudes, termed as "write strategies" to optimize the structure of the photovoltaic devices and phases of the films.

As provided in FIG. 1, the full structure of an example thin film cell is generally Support (glass)/TCO and top contact/CdS/CdTe/metal contact, where the metal serves as an ohmic contact. As shown in FIG. 1, a typical CdTe solar cell has Cadmium sulfide CdS semiconductor layer 4. Transparent conductor oxide (TCO) layers 2 and/or 3, which are coated on glass 1. Absorber layer 5 composed of CdTe is in ohmic contact with contact layer 6 such as Au, Cr—Al, Ni—Al. The 'top-contact' 7 may be silver, aluminum-chromium, or alloy as the second collector in contact with TCO layer 2, and may be connected to the next cell by way of 7A.

Figure 2:
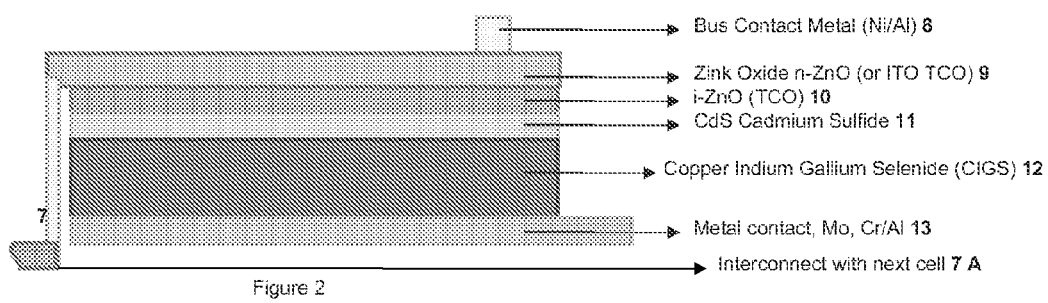
FIG. 2 is a block diagram of an exemplary embodiment of a Copper Indium Gallium Selenide (CIGS) photovoltaic device.

As provided in FIG. 2, a CIGS solar cell comprises an absorber layer composed of Copper Indium Gallium Selenide (CIGS) 12 on metal contact and support film 13. CIGS layer 12 forms a junction with Cadmium Sulfide layer 11, which in turn is in contact with TCO layers 9 and 10. Current collector 7 and bus bar 8 in contact respectively with interconnect 7A and TCO layer 9 complete the device for harnessing the solar electricity. The full structure of this type of thin film cell generally comprises ZnO/CdS/CIGS/Mo/glass, where the Mo serves as an ohmic contact at the rear of the device. ZnO layer 10 may be deposited as a bi-layer consisting of about 500 Angstroms of high resistivity ZnO (i-ZnO) followed by about 4000 Angstroms of highly conductive ZnO (ZnO:Al). CdS layer 11 (together with the i-ZnO layer 10) may be referred to as a buffer layer that is inserted between active CIGS layer 12 and ZnO transparent conductor 9. In an alternative embodiment, a Na-containing glass, e.g. soda-lime glass, may contribute to high efficiencies. A three-stage process based on vacuum evaporation can deposit CIGS as described in—M. A. Contreras, B. Egaas, K. Ramanathan, J. Hiltner, A. Swartzlander, F. Hasoon, and R. Noufi, Prog. Photovolt: Res. Appl. 7, 311-316 (1999), is incorporated herein by reference. Examples of these processes detailed in U.S. Pat. Nos. 5,441,897 and 5,436,204 are incorporated herein by reference.

In an example embodiment, chalcogenide materials may be used in photovoltaics. These chalcogenide materials may include compounds of oxygen, sulfur, selenium, tellurium, etc. with transition metals. In particular, the thin film PV built on two chalcogenide materials CdTe and CdS has become a product of high demand in the several past years and its production (already at the level of more than >5 billion USD) keeps growing. Chalcogenides may be used in exemplary embodiments to phase change memory using high and low resistive phases of chalcogenides to present two logical states. Chalcogenides can be heterogeneous materials, with element gradients, and the thin films may be composed of mixed phases.

In an example embodiment, Copper Selenide and Indium Selenide are phase change materials, proposed to be useful in electronic memory and storage. The resistance of the chalcogenide film is dependent on the "phase", and can be reversibly switched using a "set" and "reset" pulse of specified voltage and time. Interestingly, Copper-Indium-Gallium-Selenide is also present in photovoltaic devices. The approaches to preparation of efficient photovoltaic devices described to date have been to "Deposit Films by an Optimized Process". There have been some attempts to anneal the films using laser pulses after deposition, with improved performance.

In example embodiments of the disclosed systems of preparation of photovoltaic films and devices, the films of photovoltaic devices deposited using any conventional deposition or printing technique, may be "optimized" through a cycle of application voltage pulses (i-SOEP) to obtain best photovoltaic performance. Furthermore, it is possible to deliver larger portion of energy from the pulse to a particular layer of a multi-stack film by rendering one or more layers of the film relatively more conductive using exposure to selected narrow wavelengths of light corresponding to the band gap of the particular layer. For example, the absorber CIGS or CdTe layers receive energy in proportion to the resistance of the layer in a TCO—CdS-CIGS—Mo or TCO—CdS—CdTe-Metal stack if the voltage pulses are applied under irradiation of 512 nm band of light, rendering CdS more conductive. The energy E the layer receives is equal to the product of resistance 'R' and square of the numerical value of the current 'I' flowing through the stack ($E=I^2R$). Since the current 'I' through the series layers are substantially the same, the layer with higher R resistance 'R' will receive a higher portion of energy. Example embodiments may use a narrow (100 nm FWHM) irradiation on heterogeneous films, and stack in conjunction with a voltage pulse to address the performance of one or more particular layers of the photovoltaic devices.

The energy (due to Joule heating) a layer receives is $I^2R$, and since the current "I" through the layers is substantially the same, the layer with higher resistance "R" will receive a higher portion of energy. Example embodiments, therefore, may use a narrow (100 nm, FWHM) irradiation on heterogeneous films, and stack in conjunction with a voltage pulse to optimize the performance of the photovoltaic devices. Some of the film structure, composition, and chemical changes may be dependent on temperature. Therefore, in example embodiments, application of voltage pulses, under radiation, at elevated or reduced temperatures of choice may produce the best performance.

Example embodiments may involve an absorber integrated in a photovoltaic device, the absorber composed of photovoltaic material such as metal chalcogenide, a first electrode in contact with the first side of chalcogenide film or photovoltaic device, and a second electrode or a semiconductor layer in further contact with transparent conducting oxide in contact with a second side of the device. A non-limiting example embodiment of the semiconductor layer is CdS. The respective films connected to output leads of a pulse input generator with variable voltage and time duration, the electronics and photovoltaic properties of the film being optimized by the voltage pulses. An example embodiment may include devices to deliver conditioning pulses to photovoltaic devices, at manufacture and, with any interval of choice such as 12 h, 24 h, 48 h, 7 d, 180 d, the said pulses being of any magnitude. Exemplary magnitudes include ranges from 0.1 V to 1200V, and/or 0.1 V to 3000V and exemplary time duration ranges from 1~10,000 nanoseconds. Since there are a large number of factors affecting performance such as but not limited to heterogeneous phases, element gradients, ionic gradients, chemical composition gradients or regions, and phases, a particular physical or chemical process may not act as the sole factor for improvement. Rather an aggregate of such changes in resistance, hall-coefficients, and phase changes may be implemented to cause high performance.

Although it is possible to achieve substantial improvement in efficiency using a single pulse, it is more advantageous to use pulse sequences composed of pulses of varying magnitude and duration to achieve the best improvements. Such use of pulse sequences to optimize phase of metallic and chalcogenide films is know in the optical data storage, where modulated LASER pulses control the phase and reflectivity of films. This is called a 'writing system'. Example embodiments may use a 'writing system' of electrical pulses to cause phase changes and optimization of photovoltaic properties as shown by table in example 10. Without subscribing to any particular theory, the following description of film behavior may be used to explain the improvements in the performance due to application of electrical pulses. Many reasons for the improvement of photovoltaic performance using annealing techniques are possible. With the exception of annealing using short LASER pulses, the annealing techniques described so far use much longer than sub second times, e.g. 30 minutes, and bulk heating of devices to optimize performance.

The grain size of particles in the film and separation boundaries of the particles may significantly affect the photovoltaic performance. The films deposited may have substantially amorphous or grain character, with higher resistance. When a threshold voltage determined by design of experiments in each type of film or stack is reached, the electrical resistance is drastically reduced through formation of conducting paths. The conducting path may be connected crystalline domains and/or electrically conducting phases of the film material along grain boundaries, and/or defects linking the grains. The electrically conducting paths get heated and cause phase-change on boundaries to form larger grains or crystals. The pulse sequences allow for repeated and precisely controlled phase-change providing for the optimum film and grain structure. The observed photovoltaic improvements may result in the removal of defects and improved grain and film structures due to the electrical pulses of i-SOEP technology described here.

Photovoltaic Devices and Films

Chalcogenide photovoltaic devices, particularly CdTe (FIG. 1) and CIGS (FIG. 2) solar cells are commercially available. The processes for preparing film stacks and devices are well described in the literature. For example, National Renewable Energy Laboratory (NREL) report NREL/CP-520-36241, incorporated herein by reference describes synthesis and properties of CIGS and Cd—Te devices. The CIGS and Cd—Te containing devices are optimized using the i-SOEP processes of this invention.

i-SOEP Set Up for Application of Pulses

Figure 3:
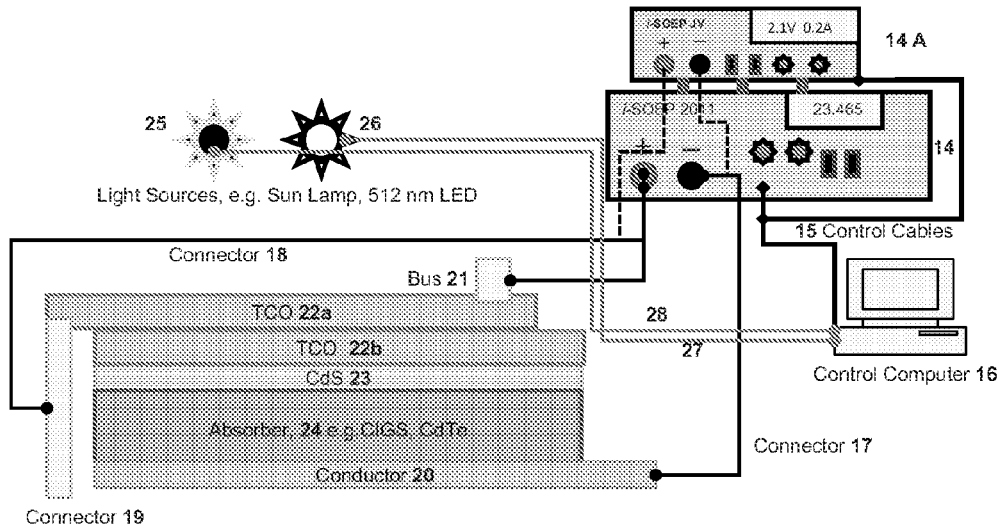
FIG. 3 is a block diagram of an exemplary embodiment of a system for preparation of a photovoltaic film.

As shown in FIG. 3 the i-SOEP set up may comprise pulse or function generator 14 and cell characteristics recorder 14 A, under the control of computer 16. Example function generators are available from Agilent technologies, Palo Alto, Calif. Agilent Model 81134A dual-channel Pulse Pattern Generator, that produces pulses in 3.35 GHz, with 15 MHz to 3.35 GHz range allows wide range of pulse sequences and is used as pulse generator 14. Computer 16 such as HP Elite Book through a GPIB, LAN, USB, or GUI interface and cables 15 controls the pulse generator. Light sources 25 (e.g. Sun spectrum lamp) and 26 (e.g. 512 nm LED) may be controlled by computer 16 through connectors 27 and 28. Pulse or function generator 14 may be used to develop algorithms for optimization of a particular product. The optimized pulse sequence can be programmed in a single pattern generator to be used in i-SOEP devices. The pulses are delivered to the device through connectors 17, 18, 19, or 21. The pulses are used to cause phase changes in absorber layer 24 and CdS layer 23, or selectively absorber layer 24, if the 512 nm LED is on, rendering the CdS layer relatively more conductive. Bus connectors 19, 20, 21, and TCO layers 22a and 22b have high conductivities compared to the semiconductor layers, and are less significantly affected by the pulses.

Pulse generator Model AVMP-4-B available from AVTECH electrosystems, Ogadensburg, N.Y. produces pulses ranging from 20 nanoseconds to 10 microseconds also shown as pulse generator 14. A computer such as HP Elite Book controls pulse generator 14 through a GPIB, LAN, USB or GUI interface. The output from pulse or function generator 14 may be directly connected to the photovoltaic devices or films or film stacks, or used to control an amplifier circuit to deliver desired voltage pulses to the devices and films. The pulse generators are used to develop algorithms for optimization of a particular material set and solar cell. The optimized pulse sequence is programmed in a single oscillator circuit or pattern generator to be used in i-SOEP devices. Smaller Integrated Circuits, (IC s) and Application Specific Integrated Circuits (ASIC s) may be programmed to incorporate all the functions, once a pulse train is determined by above setup.

In case of large solar panels such as, but not limited to a 2 ft×4 ft panel, higher voltages may be required depending on whether the photovoltaic elements of the panel are integrated in series or in parallel, or some subsets in series, and larger sets in parallel. Table 1 A and B show an example calculation of heat energy by way of radiation, joule heating, convection heating or ultrasonic heating that needs to be delivered to the film for heating the Cd—Te films to the temperature range known to cause favorable phase change in the materials for a 2 ft×4 ft cadmium telluride panel assuming the entire panel is a single element or 100 elements connected in series. The resistivity of Cd—Te can vary greatly upon deposition and annealing and the table shows one example of a solar panel. The calculation may be extended to calculate solar modules with different parameters and dimensions.

TABLE 1A

Calculation of energy input required to heat films of Cd/Te with volume of 1 cm$^3$ to a temperature change of 350° C. and 500° C.
Cd—Te

| | |
|---|---|
| Specific Heat | 210 J/kg |
| Density | 5.85 g/cm$^3$ |
| Volume | 170.94 cm3/kg |
| V Specific Heat | 1.22 Joules/cm3 |
| Temperature change | 350° C. |
| Energy input | 429.97 Joules/cm3 |
| Temperature change | 500° C. |
| Energy Input | 614.25 Joules/cm3 |

TABLE 1B

Energy input required to raise the temperature of a solar cell panel film by 500° C., which is well below the melting point, but is known to be sufficient to induce phase change 2 ft × 4 ft Cd—Te Solar Panel or CdTe film

| | | | |
|---|---|---|---|
| Length | | 61 | cm |
| Width | | 122 | cm |
| Area | | 7442 | cm$^2$ |
| Thickness | | 0.0003 | cm |
| volume | | 2.2326 | cm$^3$ |
| Resistivity | 7800 | 11000 | Ohm cm |
| Thickness | 0.0003 | 0.0003 | cm |
| Area | 7442 | 7442 | cm$^2$ |
| Resistance | 0.000314 | 0.000443 | Ohm |
| Energy | | 1371.3746 | joules |
| time | | 0.00001 | sec |
| I2R | | 137137455 | Watts |
| R | | 0.0003142 | Ohm |
| I2 | | 4.367E+11 | Amp$^2$ |
| I | | 660865.71 | Amps |
| V | | 207.64 | Volts |
| Energy Input/cm$^3$ | | 614.25 | Joules/cm$^3$ |
| From table 2A | | | |

Table 1A shows the energy required to raise 1 cm$^3$ of CdTe film to 350° C. and 500° C., since it in known that this temperature range is optimum for favorable phase change. Table 1B shows calculation of voltage to deliver sufficient electrical energy to the film by Joule heating due to applied electrical pulses, assuming total pulse width of 0.00001 sec, the total heat input required for the 2 ft×4 ft panel is 1371.38 joules, based on the known specific heat of Cadmium Telluride. The heat produced by joule heating is given by $E=I^2R\times$ time, To deliver the heat in specified time of 0.00001 second, the rate of heat generation/unit time (power) would be 137137455 watts. For the given resistance of the film based on known properties, it will require 207.65 volts to generate sufficient current in the film to generate the required amount of heat.

In such cases, the pulse generator is used to control high voltage pulses from another source. In addition high voltage pulse generators, for example GPIO-SAU series generating up to 5500 volts with 200 nanosec to 30 microsecond pulse widths, are commercially available from Systems Development and Solutions, Saint-Maur-des-Fossés—France.

Current-voltage measurements may be performed using a conventional measurement tool such as Agilent U2722A USB modular Source Measure unit 14A, available from Agilent, Calif. Software program LabView, available from LabView instruments, Austin, Tex., may be used to capture and generate photovoltaic data, with conventional digital multimeters. The resulting measurements are used for optimization of the solar cells by i-SOEP process. An example pulse train may be developed using the current voltage measurements in response to a large set of the pulse trains each differing in time and amplitude to produce the cell performance. An experimental design of a pulse duration and amplitude and sequence will provide for the best pulse sequence for a given type of manufacturing process and film.

Current-voltage (J-V) relationships measure the electrical characteristics of PV devices. An J-V curve may be obtained by exposing a photovoltaic cell to a constant level of light, while maintaining a constant cell temperature, varying the resistance of the load, and measuring the current that is produced. On an I-V plot, the vertical axis refers to current and the horizontal axis refers to voltage. The actual J-V curve typically passes through two significant points: the short-circuit current ($J_{sc}$) and the open circuit voltage ($V_{oc}$). $J_{sc}$ is the current produced when the positive and negative terminals of the cell are short-circuited, and the voltage between the terminals is zero, which corresponds to a load resistance of zero.

$V_{oc}$ is the voltage across the positive and negative terminals of the cell under open-circuit conditions, when the current is zero, which corresponds to a load resistance of infinity. The cell may be operated over a wide range of voltages and currents. By varying the load resistance from zero (a short circuit) to infinity (an open circuit), the highest efficiency may be determined as the point where the cell delivers maximum power.

Therefore, on the J-V curve, a maximum-power point ($P_m$) occurs where the product of current times voltage is a maximum. No power is produced at the short-circuit current with no voltage, or at open-circuit voltage with no current. Therefore, maximum power may be generated somewhere between these two points. Maximum power is generated at about the "knee" of the J-V curve. This point represents the maximum efficiency of the solar device in converting sunlight into electricity.

Fill factor is a parameter which quantifies the congruence of the measured J-V curve with a perfect J-V curve and describes the degree to which the voltage at the maximum power point ($V_{mp}$) matches $V_{oc}$ and that the current at the maximum power point ($I_{mp}$) matches $J_{sc}$. The higher the fill factor's percentage or match, the "perfect" the curve.

The conversion efficiency of a solar cell is the percentage of the solar energy shining on a PV device that is converted into electrical energy, or electricity. Improving this conversion efficiency helps to optimize the photovoltaic devices, rendering them cost competitive with more traditional photovoltaic devices.

As shown in FIG. 3, light sources such as LED of bandwidth of preferably <100 nm FWHM are used to selectively render a layer of the film stack more conductive than other layers. For example, Cadmium sulfide, a photo conductor, has a band gap of 2.36 eV to 2.42 eV, which corresponds to 525 nm to 512 nm radiation band. D. Lincot, Gary Hodes *Chemical Solution Deposition of Semiconducting and Non-Metallic Films: Proceedings of the International Symposium* The Electrochemical Society, 2006 ISBN 1566774330, describes the band gap of cadmium sulfide, and is incorporated herein by reference. Therefore, Cadmium sulfide layer of a stack can be selectively rendered conductive using irradiation at the 512 nm band. The CIGS absorber has a band gap of 1192 nm to 765 nm, and the CdTe absorber has a band gap at ~770 nm, which can be somewhat varied by deposition techniques. Therefore, irradiation of the device or stack with 512+/−100 nm band light will render CdS more conductive than the other stack layers, allowing selective energy delivery. Example light source useful in the practice of invention to render the CdS layer conductive is 130 mW Luxeon Rebel LXML-PE01-0070 70 350 130 700, Cyan LED wave length minimum 490 nm, typical 505 nm, maximum 520 nm, FWHM 30 nm; Available from Quadica Developments Inc., Brantford, Ontario, Canada.

Figure 4:
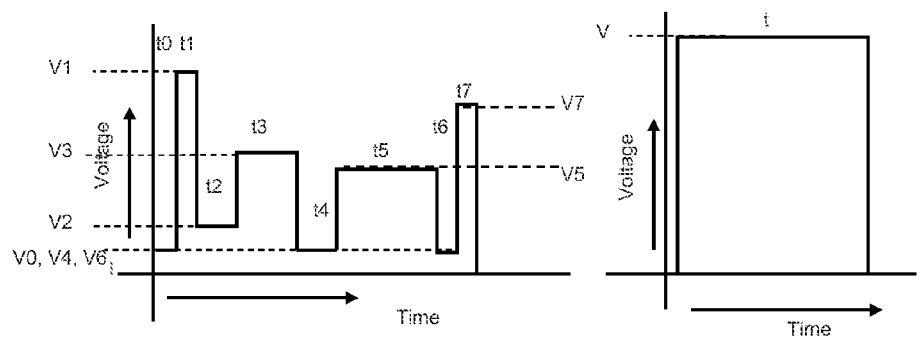
FIG. 4 is a timing diagram of an exemplary (waveform) pulse train for optimization of phase change and photovoltaic performance.
Figure 5:
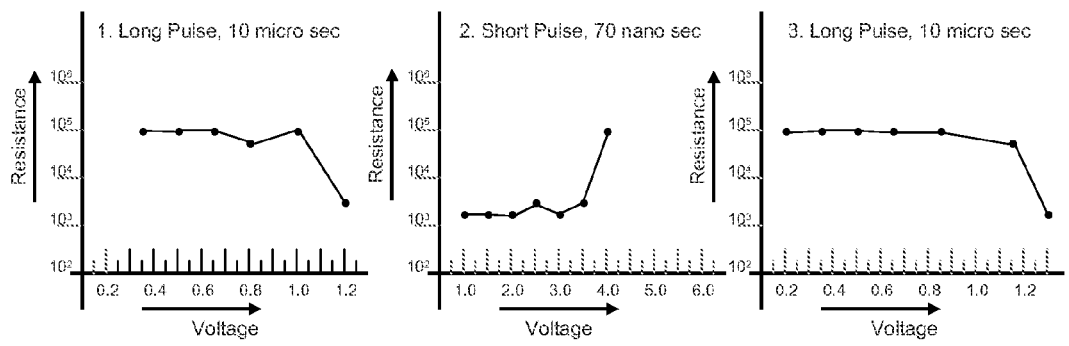
FIG. 5A is a graph of the change in resistance in an example embodiment of phase change of films of Chalcogenides.
FIG. 5B is a graph of the change in resistance in an example embodiment of phase change of films of Chalcogenides.
FIG. 5C is a graph of the change in resistance in an example embodiment of phase change of films of Chalcogenides.

Chalcogenides undergo forward and reverse phase change upon application of electrical pulses. The changes cause predictable changes in electronic properties including resistance. This property has been studied for design of memory devices as described by Lee, H.; Kang, D-H; Tran, L. in Materials Science and Engineering B, 119, 196-201, incorporated herein by reference. As shown in FIG. 4, Example embodiments of this disclosure use simple or complex electrical pulse sequences to optimize photovoltaic properties of the films. FIG. 5 shows the change is dependent on the magnitude and time of the pulses for Indium Selenide films with thickness of 150 nm to 200 nm, and area of ~19 to ~25 square microns. These changes in chalcogenides by electrical joule heating using well designed and programmed pulses improve photovoltaic performance. The resistance variation between the high and low values is used as one of the indicators for the desired change.

Energy calculations: The changes in semiconductor layers generally referred to as 'phase' changes effect electronic and photovoltaic properties. In some cases, such as Indium Diselenide, exhibit two distinct phases can be recognized based on resistance. FIG. 5 illustrates such changes in High and Low state of resistance, dependent on the duration and voltage of the electrical pulse. FIG. 5A shows the effect of 10 microsecond electrical pulses at increasing amplitude of voltage on an Indium Diselenide film with 5 micron dimension and 150 angstrom thickness. The resistance 'switches' at ~1.2 Volts due to 'phase change' of the film materials from amorphous to crystalline phase. FIG. 5B shows application of short pulses of 70 nanosecond, where the 'phase change' of crystalline phase requires more energy and occurs at higher voltage, and the resistance increases due to conversion to amorphous phase. FIG. 5C shows the 'reset' of the amorphous phase back to crystalline phase, where lower voltage and higher duration produces the crystalline phase and lower resistance. The increase in voltage beyond a 'threshold' voltage delivers sufficient energy for these phase changes. Without subscribing to any particular theory, the high resistance may be attributed to an amorphous phase, while the low resistance may be attributed to a crystalline phase. The high voltage, short duration pulses cause amorphous phase, while the relatively long duration, low voltage pulse causes crystallized phase. The transitions depend on the amount of energy supplied and the time duration of the pulse. In an example embodiment, pulses less than a millisecond may allow for low energy dissipation. In order to effect the necessary changes, the input energy meets the 'threshold' value. A calculation of energies for $In_2Se_3$ High to Low (Table 1) and Low to High (Table 3) resistance is shown below.

TABLE 2

High to Low Resistance Transition Energy Based on a 5 micron square and circular devices with 150 and 200 Angstrom thickness.
$In_2Se_3$ H to L resistance

| Film thickness | | 150 | Angstrom | 1.5E−06 | cm |
|---|---|---|---|---|---|
| Area 1 | Square | 25 | sq. micron | 2.5E−07 | $cm^2$ |
| Area2 | Circle | 19.7 | sq. micron | 2E−07 | $cm^2$ |
| 150 A Sq | Volume 1 | | 3.75E−13 | $cm^3$ | |
| 150 A Cir | Volume 2 | | 2.955E−13 | $cm^3$ | |
| 200 A Sq | Volume 3 | | 5.00E−13 | $cm^3$ | |
| 200 A Cir | Volume 4 | | 3.94E−13 | $cm^3$ | |
| Resistance | | | 100000 | Ohm | |
| Voltage | | | 1.2 | V | |
| Current | | | 0.000012 | amp | |
| Time | | | 0.00001 | sec | |
| Power | | | 0.0000144 | Watts | |
| Energy | | | 1.44E−10 | Joules | |
| Energy/Volume | | | 288 | $Joules/cm^3$ | 200 A sq |
| Energy/Volume | | | 384 | $Joules/cm^3$ | 150 A sq |

The table assumes $In_2Se_3$ film in contact with conductors to deliver electrical energy to the film. The film is 150 Angstrom thick and 5 micron square or circle. There 'as deposited' resistance is of the order of 100000 ohms. If a series of pulses of increasing voltage and fixed 10 microsecond duration is applied, resistance change is observed at 1.2 volts. From Joules's law of electrical heating, the energy required is calculated for the film and then extrapolated to per-unit volume. Table 2 represents energy calculation for an amorphous to crystalline phase where the resistance changes from 100,000 to 1000 ohms. Table 3 shows reversal of the crystalline (low resistance) to amorphous (high resistance) phase calculation for the same film. In order to form amorphous film, near complete melting of film in a very short duration must occur, requiring higher energy.

TABLE 3

Low to High Resistance Transition Energy Based on a 5 micron square and circular devices with 150 and 200 Angstrom thickness.
$In_2Se_3$ L to H resistance

| | Film thickness | 150 | Angstrom | 1.5E−06 | cm |
|---|---|---|---|---|---|
| | Area 1 | 25 | sq. micron | 2.5E−07 | $cm^2$ |
| | Area 2 | 19.7 | sq. micron | 1.97E−07 | $cm^2$ |
| 150 A Square | Volume 1 | 3.75E−13 | $cm^3$ | | |
| 150 A Circle | Volume 2 | 2.955E−13 | $cm^3$ | | |
| 200 A Square | Volume 3 | 5.00E−13 | $cm^3$ | | |
| 200 A Circle | Volume 4 | 3.94E−13 | $cm^3$ | | |
| Resistance | | 1000 | Ohm | | |
| Voltage | | 3.8 | V | | |
| Current | | 0.0038 | amp | | |
| Time | | 0.00 | sec | | |
| Power | | 0.01444 | Watts | | |
| Energy | | 1.011E−09 | Joules | | |
| Energy/cm3 | | 2022 | $Joules/cm^3$ | 200 A sq | |
| | | 2695 | $Joules/cm^3$ | 150 A sq | |

From the tables in this exemplary embodiment, the crystalline (low resistance) to amorphous (high Resistance) phase transition uses ten times more energy; most likely due to the melting event that is required for formation of the amorphous phase.

Interestingly, for comparison, LASER annealing using 248 nm LASER has been reported by Wang, X.; Li, S. S.; Huang, C. H.; Rawal, S.; Howard, J. M.; Craciun, V.; Anderson, T. J.; and Crisalle, O. D. in Solar Energy Materials & Solar Cells, 88, 65-73 (2005). Table 3 shows the LASER energies used for non-melt annealing of CIGS films. In these experiments, pulsed LASER annealing is used to achieve significant improvements in photovoltaic performance. The table shows energy calculation for a 1 micron photovoltaic film with 1 $cm^2$ area, assuming 25% absorption of the LASER energy. Table 4 shows calculation of the LASER energy, with 25% conversion to heat, used in the improvement of photovoltaic devices.

TABLE 4

Energy calculation for LASER annealing

| Incident energy/$cm^2$ | 0.15 | Joules |
|---|---|---|
| Thickness | 0.0001 | cm |
| Volume | 0.0001 | cm3 |
| Total LASER | | |
| Energy | 1500 | Joules/cm3 |
| 25% Absorption | 375 | Joules/cm3 |

The energy requirements from Table 1 of 384 $Joules/cm^3$ is remarkably close to the 375 $Joules/cm^3$ value in LASER annealing.

As shown in Tables 1 and 5, the energies for transition of Cadmium Telluride may be calculated based on the temperature changes desired. Telluride phase transitions are possible by annealing films between 300° C. to 500° C., far below its melting point. Table 5 shows energy calculation for a Cadmium telluride film transitions at 300° C. and 500° C.

TABLE 5

Cadmium Telluride energies for achieving phase change temperature

| Specific Heat | 210 | J/kg |
|---|---|---|
| Density | 5.85 | $g/cm^3$ |
| Volume | 170.94017 | cm3/kg |
| V Specific Heat | 1.2285 | Joules/cm3 |
| Temperature change | 350° | C. |
| Energy input | 429.975 | Joules/cm3 |
| Temperature change | 500° | C. |
| Energy Input | 614.25 | Joules/cm3 |

The changes in electrical resistance and remarkable improvement photovoltaic properties by application of energy to CIGS photovoltaic cells is shown in Table 6.

TABLE 6

Energy application, Series cell resistance and photovoltaic efficiency improvements

| | Control | CIGS 1 | CIGS 2 |
|---|---|---|---|
| Energy $J/cm^3$ | 0 | 375 | 750 |
| Series Resistance (Cell) | 10.17 | 14.06 | 15.94 |
| Efficiency % | 7.69 | 13.41 | 12.22 |
| Improvement % | | 5.72 | 4.53 |

The table shows performance of photovoltaic cells, where the control cell is 'as manufactured.' The CIGS 1 cell is exposed to 375 $J/cm^2$ of energy and CIGS 2 cell is exposed to 750 $J/cm^2$ of energy. The efficiency is calculated from the photovoltaic measurements. The series resistance change indicates change in the phase of the absorber.

To prepare a photovoltaic film, a combination of pulses called 'electrical writing system' is used to optimize photovoltaic films. According to the labels of times and voltage graph in FIG. 4, Table 6 below shows the exemplary value ranges for optimization of a 1 $cm^2$ CIGS or CdTe photovoltaic device for a 20 microsecond pulse. Although seven time segments are shown per pulse train (period), any number of voltages and time intervals greater than zero can be used for optimization. The pulse sequence is developed in stages. In the first stage, a single pulse with sufficient energy (per the calculation based on film volume and specific heat) is applied with time and voltage as input variables, and photo voltaic efficiency as output result. The best pulse duration and energy provides the single pulse waveform shown in FIG. 4.

Once such a pulse is defined, the total energy is determined, and kept constant over two pulses, where a matrix of time and amplitude is changed in 10 intervals as an input variables. This provides 100 data points correlating the input to pulse sequence, and output of photovoltaic efficiency. The design is further refined for additional voltage and time values. Generally, no more than eight events in a pulse train are required to achieve significant performance improvement. An example of a pulse train for CIGS optimization is shown in FIG. 4. The best pulse sequence is determined using an experimental design for each type of device and production process. The calculation based on film mass and specific heat provide starting point to calculate total energy input value for a single pulse. Single pulses corresponding to this energy between 10 nanoseconds to 1 millisecond are applied to determine the total duration of the pulse. Then, spaced voltage and time pulses of experimental design corresponding to the total energy are applied. Generally, pulses over one millisecond result in too much energy dissipation due to convection and radiation losses, and results in mass transfer events such as melting.

Subsequently a two to eight pulse pulse train of equal magnitude and an even or uneven time delay are applied, where the total energy input remains same. Following this, a matrix of pulse magnitudes and durations is applied and the optimum value is determined by experimental design. The pulse sequence thus found is applicable to all devices of the same design and production process. This process is iteratively repeated to achieve optimum results. It is to be understood that each of the processes and structure of photovoltaic devices has a characteristic pulse train. Once this is identified, it can be applied to all the devices produced using the same process and of the same design. For example, once the pulse sequence for a particular production and type of solar cell is known, the same pulse sequence can be applied to tens, hundreds, or millions on the same production line.

TABLE 7

Pulse segment width and times for a 20 microsecond pulse for a 1 cm² device.

| Pulse segment | Pulse Element Time (Microseconds) | Voltage |
| --- | --- | --- |
| t0 | 1 | V0 0.2 |
| t1 | 2.5 | V1 1.4 |
| t2 | 3 | V2 0.4 |
| t3 | 4 | V3 1.25 |
| t4 | 1 | V4 0.2 |
| t5 | 5 | V5 1.20 |
| t6 | 1 | V6 0.2 |
| t7 | 2.5 | V7 1.3 |

Figure 6:
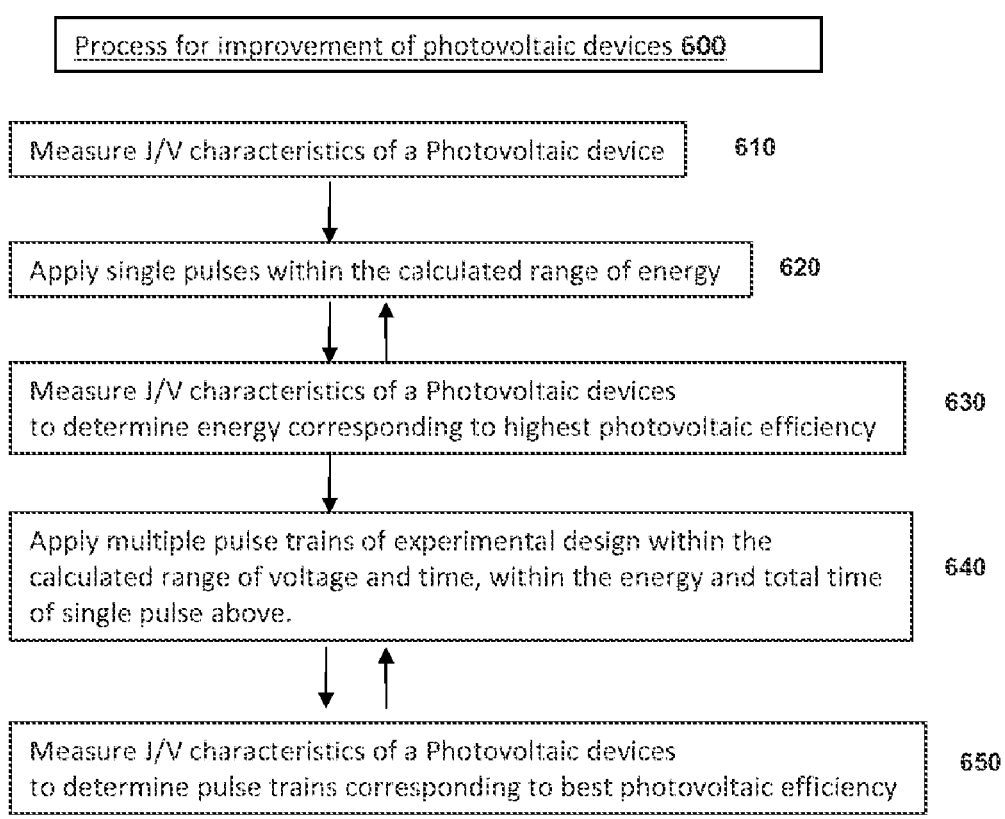
FIG. 6 is a flow process diagram of an example embodiment of a method of preparation of a photovoltaic film.

FIG. 6 provides flow chart 600 of an example embodiment of a method of preparation of photovoltaic films and devices. In block 610, the energy/voltage (J/V) characteristics of a photovoltaic film/device are measured. In block 620, single pulses are applied to the film/device within the calculated or measured range of energy. In block 630, the J/V characteristics of the photovoltaic film/device are measured to determine energy corresponding to a maximum photovoltaic efficiency for the pulse applied in block 620. The single pulses are again applied in block 620 with different voltage and time characteristics and the J/V characteristics are again measured in block 630 until an optimum efficiency is determined. This may be done iteratively. In block 640, multiple pulse trains are applied within the measured range of voltage and time. In block 650, the J/V characteristics of the photovoltaic film/device is measured and block 640 and 650 are repeated to determine the pulse train corresponding to an optimum efficiency. The pulse train may then be used for other devices of the same type, design, and/or process to achieve high photovoltaic efficiency. The pulse train may also be programmed in an IC or ASIC device for field use.

Although embodiments of the present disclosure have been described in detail, it should be understood that various changes, substitutions and alterations can be made thereto without departing from the spirit and scope of the embodiments as defined by the appended claims.

The invention claimed is:

1. A method comprising:
   measuring energy/voltage (J/V) characteristics of a photovoltaic material, film or device;
   applying a single electrical pulse to the photovoltaic material within the calculated and measured range of energy;
   determining a voltage and time characteristics of a pulse that produces a maximum efficiency for the photovoltaic material;
   applying a train of electrical pulses within the measured pulse characteristics; and
   determining a train of pulses which produces a maximum efficiency based on measured J/V for the photovoltaic material, film or device.

2. The method of claim 1, wherein the photovoltaic material comprises at least one of a photovoltaic semiconductor film stack, a semiconductor junction, and a photovoltaic device.

3. The method of claim 1, further comprising applying the train of electrical pulses to a plurality of substantially similar photovoltaic materials.

4. The method of claim 1, wherein the photovoltaic material comprises at least one of semiconductor and chaclogenide films comprising at least one of transition metal or electropositive elements comprising Cu, In, Cd, Ga, Zn, Sn, Sb, Fe, Pb, Ge, As, Si, Ti, and C, and electronegative elements such as Te, S, Se, O, P, N, B, and F.

5. The method of claim 1, wherein the photovoltaic material, film, or device is exposed to a light source of a frequency band substantially matched to a band gap of the photovoltaic material during application of pulses.

6. The method of claim 1, further comprising elevating temperature to improve performance of the photovoltaic material.

7. The method of claim 1, wherein the photovoltaic material is exposed to at least one narrow band of radiation during pulse application, the band of radiation matched to an energy level of a band gap of at least one layer of the photovoltaic material, film, stack, or device.

8. The method of claim 1, wherein the photovoltaic material comprises a plurality of photovoltaic devices connected in at least one of series or parallel.

9. The method of claim 1, wherein the pulse comprises at least one of a DC level and a high frequency AC pulse.

10. The method of claim 9, wherein the DC level or AC pulses are applied in a predetermined sequence, the sequence comprising a particular waveform of voltage or current amplitudes.

11. A system of preparing photovoltaic material comprising:
- a voltage source configured to output voltage pulses;
- a control circuit electrically connected to the output of the voltage source, the control circuit configured to apply the voltage pulses to a photovoltaic material; and
- a feedback circuit electrically connected to the photovoltaic material, the feedback circuit configured to measure resistance and energy/voltage (J/V) characteristics of the photovoltaic material.

12. The system of claim 11, further comprising adjusting the voltage source based on the measured J/V characteristics.

13. The system of claim 11, wherein the photovoltaic material comprises at least one of semiconductor and chaclogenide films comprising at least one of transition metal or electropositive elements comprising Cu, In, Cd, Ga, Zn, Sn, Sb, Fe, Pb, Ge, As, Si, Ti, and C, and electronegative elements such as Te, S, Se, O, P, N, B, and F.

14. The system of claim 11, further comprising applying the train of pulses to a plurality of substantially similar photovoltaic materials.

15. The system of claim 11, wherein the voltage source is programmed to electrically contact the photovoltaic material and deliver a preprogrammed sequence of voltage pulses.

16. A device comprising photovoltaic material, the photovoltaic material configured by applying a train of voltage pulses to the photovoltaic material, the train of pulses configured by measuring energy/voltage (J/V) characteristics of the photovoltaic material.

17. The device of claim 16, wherein the photovoltaic material comprises at least one of semiconductor and chaclogenide films comprising at least one of transition metal or electropositive elements comprising Cu, In, Cd, Ga, Zn, Sn, Sb, Fe, Pb, Ge, As, Si, Ti, and C, and electronegative elements such as Te, S, Se, O, P, N, B, and F.

18. The device of claim 16, wherein the photovoltaic material is exposed to a light beam of a frequency band substantially matched to a band gap of the photovoltaic material during pulse application.

19. The device of claim 16, wherein the photovoltaic material is exposed to at least one narrow band of radiation, the band of radiation matched to an energy level of a band gap of at least one layer of the photovoltaic material during pulse application.

20. The device of claim 16, wherein the photovoltaic material comprises a plurality of photovoltaic devices connected in at least one of series or parallel.

* * * * *